United States Patent
Seidel

(10) Patent No.: US 10,089,733 B2
(45) Date of Patent: Oct. 2, 2018

(54) METHOD FOR DETERMINING A POSITION OF A STRUCTURE ELEMENT ON A MASK AND MICROSCOPE FOR CARRYING OUT THE METHOD

(71) Applicant: Carl Zeiss SMT GmbH, Oberkochen (DE)

(72) Inventor: Dirk Seidel, Jena-Leutra (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 51 days.

(21) Appl. No.: 15/281,760

(22) Filed: Sep. 30, 2016

(65) Prior Publication Data

US 2017/0091921 A1   Mar. 30, 2017

(30) Foreign Application Priority Data

Sep. 30, 2015  (DE) .................. 10 2015 218 917

(51) Int. Cl.
*G06K 9/00* (2006.01)
*G06T 7/00* (2017.01)

(52) U.S. Cl.
CPC .. *G06T 7/0004* (2013.01); *G06T 2207/10056* (2013.01); *G06T 2207/30141* (2013.01)

(58) Field of Classification Search
CPC .... G03F 1/84; G03F 7/70283; G03F 7/70358; G03F 7/70733
USPC ....... 382/141, 144, 145, 149, 190, 278, 283, 382/287, 294; 358/537, 538, 448
See application file for complete search history.

(56) References Cited

U.S. PATENT DOCUMENTS

| | | | | |
|---|---|---|---|---|
| 4,419,013 A | | 12/1983 | Heimer | |
| 5,612,986 A | * | 3/1997 | Howells | G03F 7/70408 378/34 |
| 6,466,312 B1 | * | 10/2002 | Li | G01J 1/04 356/218 |
| 6,580,502 B1 | * | 6/2003 | Kuwabara | G01N 21/9501 250/559.41 |
| 6,628,372 B2 | * | 9/2003 | McCullough | G03F 7/70283 355/53 |

(Continued)

FOREIGN PATENT DOCUMENTS

| | | | | |
|---|---|---|---|---|
| DE | 10047211 | 5/2002 | | G01B 11/24 |
| DE | 10337767 | 3/2005 | | H01L 21/66 |

(Continued)

OTHER PUBLICATIONS

Antonello et al., "Modal-based phase retrieval for adaptive optics", *Journal of the Optical Society of America*, vol. 32, No. 6, pp. 1160-1170 (Jun. 2015).

(Continued)

*Primary Examiner* — Yosef Kassa
(74) *Attorney, Agent, or Firm* — Fish & Richardson P.C.

(57) ABSTRACT

A method and a microscope for determining a position of a structure element on a mask are provide. The method comprises predefining a region on the mask which comprises at least the structure element; determining a phase image of the region, wherein the phase image comprises in a spatially resolved manner the phase of the imaging of the mask by the illumination radiation; and determining the position of the structure element within the phase image.

27 Claims, 8 Drawing Sheets

(56) References Cited

U.S. PATENT DOCUMENTS

| | | | | |
|---|---|---|---|---|
| 6,967,713 | B2* | 11/2005 | McCullough | G03F 7/70283 355/53 |
| 7,027,502 | B2* | 4/2006 | Corless | H03H 17/0294 329/304 |
| 7,072,502 | B2* | 7/2006 | Hemar | G01N 21/95607 356/237.1 |
| 7,587,704 | B2* | 9/2009 | Ye | G03F 7/70441 378/35 |
| 7,617,477 | B2* | 11/2009 | Ye | G03F 7/70441 716/56 |
| 7,648,802 | B2* | 1/2010 | Neureuther | G03F 1/30 356/601 |
| 7,742,632 | B2* | 6/2010 | Badger | G03F 1/84 382/144 |
| 2002/0057839 | A1 | 5/2002 | Rinn et al. | |
| 2005/0037270 | A1 | 2/2005 | Gerlach | |
| 2010/0153059 | A1 | 6/2010 | Klose et al. | |
| 2010/0208935 | A1 | 8/2010 | Arnz et al. | |
| 2010/0254611 | A1 | 10/2010 | Arnz | |
| 2012/0063666 | A1 | 3/2012 | Arnz et al. | |
| 2012/0081712 | A1 | 4/2012 | Laengle | |
| 2012/0121205 | A1 | 5/2012 | Arnz et al. | |
| 2012/0314910 | A1 | 12/2012 | Arnz | |
| 2013/0019212 | A1 | 1/2013 | Seidel et al. | |

FOREIGN PATENT DOCUMENTS

| | | | |
|---|---|---|---|
| DE | 102007009661 | 3/2008 | ............ G02B 27/50 |
| DE | 102006059431 | 6/2008 | ............ G03F 7/20 |
| DE | 102007033815 | 11/2008 | ............ G02F 9/00 |
| DE | 102009015594 | 10/2010 | ............ G01B 11/03 |
| DE | 102010045135 | 3/2012 | ............ G03F 9/00 |
| DE | 102010047051 | 3/2012 | ............ G06T 7/60 |
| DE | 102011077296 | 12/2012 | ............ G01B 11/14 |
| DE | 102011078999 | 1/2013 | ............ G03F 9/00 |
| DE | 102014110302 | 9/2015 | ............ G02B 21/00 |
| DE | 102014112242 | 3/2016 | ............ G02B 27/52 |
| WO | WO 2008/025433 | 3/2008 | ............ G01J 9/00 |

OTHER PUBLICATIONS

Zheng et al., "Wide-field, high-resolution Fourier ptychographic microscopy", *Nature Photonics*, vol. 7, pp. 739-745 (Sep. 2013).

Germany Office Action for German Application No. 10 2015 218 917.1 dated May 25, 2016 (7 pages).

Perlitz, et al., "Phame TM: a novel phase metrology tool of Carl Zeiss for in-die phase measurements under scanner relevant optical settings", *Proc. of SPIE*, vol. 6518, pp. 65184R-1-65184R-8 (Mar. 2007).

* cited by examiner

METHOD FOR DETERMINING A POSITION OF A STRUCTURE ELEMENT ON A MASK AND MICROSCOPE FOR CARRYING OUT THE METHOD

CROSS-REFERENCE TO RELATED APPLICATION

Under 35 U.S.C. § 119, this application claims priority to German Patent Application 10 2015 218 917.1, filed on Sep. 30, 2015. The disclosure content of the above application is hereby incorporated by reference in its entirety.

TECHNICAL FIELD

This patent specification relates to a method for determining a position of a structure element on a mask and a microscope for carrying out the method.

BACKGROUND

In lithography, in order to produce semiconductor components by use of scanners or steppers, the structures of masks, which are also referred to as reticles, are projected onto wafers coated with a light-sensitive layer, the resist. Masks can be embodied for example as "binary masks" having chromium structures on quartz glass or as phase-shift masks. Reflective masks are used for application in EUV lithography. In mask inspection microscopes or position measuring devices, the structure of a reticle is projected onto a light-sensitive spatially resolved detector, such as a charge coupled device (CCD) chip, for example, with the aid of optical units.

By use of a positioning measuring device (registration tool), specific structure elements referred to as "registration pattern" or as "marker" on a mask, such as, for example, squares, crosses or angles having predefined shapes are measured and compared with the setpoint positions thereof. Positions of structure elements on the mask which are part of the used structures of the mask are also measured. This is referred to as "real pattern registration". The deviation of the setpoint position of a structure element from the actual position thereof on the mask is the positioning error; the latter is also referred to as "registration" or "register error".

The measurement of the masks makes it possible, in the mask writing process using electron beam writers, to check the positional accuracy of the structures on the mask. Furthermore, the measurement of the structures of an existing mask set makes it possible to qualify the deviation of the structure positions of the different masks for the individual lithographic layers with respect to one another.

For monitoring positions of structure elements, an aerial image of a segment of a mask is recorded by use of a position measuring device. The mask lies in this case on a stage (also referred to as specimen stage or displacing unit) which allows the mask to be displaced in the direction of the mask plane in order to enable the positioning of a desired segment in the image field of the position measuring device for recording the image by use of a detector. The mask is aligned before the measurement on the stage, such that its position on the stage is known. Alternatively, a relative alignment of the mask with respect to specific alignment structure elements can also be effected. The position determination is then effected relative to these structure elements, also referred to as alignment markers. Consequently, the image can be unambiguously assigned to the absolute or relative position of the segment on the mask. By determining the position of the structure within the recorded image, it becomes possible to compare setpoint and actual positions of the structures on the mask and thus to calculate the positioning error.

The requirements made of the accuracy of the measurement when determining positions of structure features on masks are 1 nm, but are to be improved to 0.5 nm and beyond in the next generation of devices.

When determining positions of structure elements, methods are used for determining the positions of said structure elements in aerial images. Methods such as, for example, threshold methods or correlation methods are known. The requirements made of the accuracy of the position to be determined or of the positioning error to be determined of a structure element are higher than the resolution of an aerial image recorded by the position measuring device.

DE 12006059431 describes a method for determining with subpixel accuracy the position of a structure on a carrier relative to a reference point of the carrier by superimposing the structure with a reference structure.

DE 10047211 discloses a method for determining the position of edges of a structure with subpixel accuracy. Here the measured edge profiles are compared with model intensity profiles in order to find the position of best correspondence.

DE 10337767 discloses a method for determining the distance between a reference element and a structure for measuring the overlay displacement.

DE 102007033815 discloses a method for determining the distance between a reference element and a structure with two pattern elements for measuring the overlay displacement, wherein one of the pattern elements, whose position is to be determined, is amplified in the reference element or in the structure.

The requirements made of the next generation of position measuring devices are still not attained by the application of these methods.

SUMMARY

In a general aspect, the invention provides an efficient method which enables a more accurate determination of the position of a structure element on a mask.

According to the invention, a method for determining a position of a structure element on a mask is provided, the method comprising the following steps:
 predefining a region on the mask which comprises at least the structure element,
 determining a phase image of the region, wherein the phase image comprises in a spatially resolved manner the phase of the imaging of the mask by the illumination radiation, and
 determining the position of the structure element within the phase image.

Structure elements on the mask may be crosses or squares, for example, which were written on the mask for test purposes. The term structure elements also encompasses used structures or segments of used structures, for example an edge or a corner.

The method according to the invention can also be used in the measurement of linewidths. The linewidth or its deviation from a setpoint value results from the distance between the positions of the two edges of a line.

The phase image is determined by the recording of a plurality of individual images (amplitude images) by a microscope followed by an image evaluation for determining the phase image or by the direct recording of a phase image by a specific microscope.

Initially only a spatially resolved distribution of the intensity of the illumination radiation after interaction with the object is measured by the individual images measured in the image plane of a microscope. Said intensity is the absolute value of the square of the amplitude of the illumination radiation after interaction with the object. These images are referred to as aerial images, intensity images or amplitude images.

The phase image can be determined from a plurality of amplitude images recorded during image capture. After the image capture step, a reconstruction step may then be provided. Said reconstruction step involves reconstructing a phase image from the amplitude images recorded during image capture.

Individual aerial images can be recorded with coherent illumination. It is also possible to record the individual aerial images with non-coherent illumination and to determine a phase image on the basis thereof. The determined phase is then referred to as equivalence phase. In this case, too, the phase image has steeper edges than the intensity image. It has been recognized that the equivalence phase can be used as a basis for a registration measurement in just the same way as the image phase.

Various methods can be provided for the reconstruction step. In particular, a method selected from the following list can be provided: phase determination by use of an Iterative Fourier Transformation Algorithm (IFTA), in particular by use of a Gerchberg-Saxton algorithm, model-based phase determination, methods based on the Transport of Intensity Equation (TIE), and Fourier ptychography. Further methods for determining the image phase or the equivalence phase in the reconstruction step are likewise possible. For details of phase determination by use of an iterative Fourier transformation algorithm, reference should be made to WO 2008/025 433 A2.

In the model-based phase determination, the phase is not determined pixel by pixel, rather the parameters of a model, for example Zernike polynomial, are determined in particular iteratively. A modal decomposition of the unknown phase function is taken as a basis. By applying the extended Nijboer-Zernike theory (ENZ), for example, it is possible to represent the phase function by a small number of complex Zernike polynomials.

The term phase image also denotes images which contain a mixture of phase information and amplitude information. The direct measurement of such phase images can be effected for example by a Zernike phase contrast microscope or by a differential interference contrast microscope.

The image analysis when determining the position comprises the phase image evaluation in this method. It can optionally also comprise an evaluation of the amplitude image and in particular a comparison of the results of the phase image evaluation with those of the intensity image evaluation.

The phase image evaluation can be carried out by use of threshold methods. For details, reference is made for example to DE 10 2009 015 594 A1. The phase image evaluation can also be carried out with the aid of correlation-based methods. For details, reference should be made to DE 10 2011 078 999 A1 and DE 10 2011 077 296 A1. The cited documents are fully incorporated by reference in this patent specification.

According to the invention it has been recognized that phase images have a higher edge steepness than intensity images. By analyzing a phase image, it is thus possible to increase the accuracy and reproducibility of the localization of the structure features.

In the individual image analysis, in particular in the registration measurement of microscope images, the edge steepness of the imaged structures is of crucial importance for the accuracy and reproducibility of the measurement. By way of the edge steepness m, image noise $\delta I$ always present in the camera image is translated into position noise $\delta x$ of the detection, specifically according to the formula $\delta x = \delta I / m$ (see FIG. 1).

This is the case in particular for small structures, in particular for structures which exhibit a low edge steepness on account of diffraction effects. FIG. 2 illustrates by way of example a comparison of an object amplitude 1 with an image amplitude 2. The illustrated amplitudes 1, 2 are the amplitudes 1, 2 of an object having a linewidth of 125 nm with coherent illumination with a wavelength of $\lambda=193$ nm and a numerical aperture NA=0.6. The phase jump of the object phase is $\pi$. The reduced edge steepness of the image amplitude 2 in comparison with the object amplitude 1 is visible.

FIG. 3 illustrates by way of example an object phase 3 and an image phase 4 for the same object. The image phase 4 has a somewhat lower edge steepness than the object phase 3, but a higher edge steepness than the image amplitude 2. The image phase 4 shows that the linewidth of the object phase 3 remains substantially the same. Depending on the structure to be imaged and the conditions during imaging, a widening of the image phase relative to the object phase can also take place.

In a further configuration of the invention, for determining the phase image, at least two aerial images of the region of the mask are recorded, wherein the at least two aerial images are recorded under diversified conditions.

The phase image is determined from at least two suitable aerial images, i.e. amplitude images, of the measured region of the substrate. At least two images are recorded, wherein the recording conditions differ in a defined manner.

In one variant of the method, for recording the at least two images, the aerial image of the region to be examined is recorded in the best focal plane as first image and an image of a pupil plane of the imaging beam path of a microscope used is recorded as second image.

In a further configuration of the invention, the diversifications can be described by mathematical models.

This measure has the advantage that known algorithms for determining the phase image can be used.

In a further configuration of the invention, the diversification is effected by the recording of the at least two aerial images in parallel planes spaced apart from one another.

This measure has the advantage that already existing microscopes can be used for determining phase images in a simple manner. The distance between the planes can lie in the direction of the optical axis of an optical unit used; this direction is referred to here as the Z-direction.

Numerous methods are available for determining phase images from a set of spaced-apart parallel planes, which is also referred to as an image stack, focus stack or Z-stack. Thus for example the IFTA algorithm or the TIE algorithm.

In a further configuration of the invention, the recording of one of the aerial images is effected in the best focal plane.

This measure has the advantage that, on the one hand, this aerial image can be used as part of the image stack for determining the phase image; on the other hand, this aerial image can also be evaluated directly.

In a further configuration of the invention, the diversification is effected by a spatial frequency filtering in the pupil plane of the imaging beam path of the imaging.

This measure allows a rapid and simple recording of individual images and determination of diversified images, as known for example from the published German patent application DE 102007009661.

In a further configuration of the invention, the diversification is effected by the recording of the at least two aerial images with different illumination directions.

This measure encompasses the determination of phase images by Fourier ptychography and the recording of phase images by a differential interference contrast microscope. This is explained in detail below.

In one variant of the method, the beam shape property of the illumination is diversified. Beam shape property should be understood to mean, for example, the amplitude, the phase of the illumination radiation or the shape of the aperture of an illumination stop.

In a further configuration of the invention, determining the first phase image is effected by recording an image of the region by use of a phase contrast microscope.

By way of example, a Zernike phase contrast microscope or a differential interference contrast microscope can be used as the phase contrast microscope.

This measure has the advantage that a phase image is obtained rapidly by use of a single recording.

In a further configuration of the invention, the method comprises the following step:
    determining the positioning error of the structure element as distance of the position of the structure element from a setpoint position of the structure element in the phase image.

In a further configuration of the invention, the method comprises the following step:
    determining the setpoint position of a structure element from the position of the structure element within a simulated phase image of the region of the mask.

By use of this measure, a setpoint position is determined, which is directly comparable with the positions determined from the measured phase image.

In the general case, a phase image is not directly comparable with the aerial image (the image amplitude). In the phase image, for example, the linewidth of the image phase can deviate from the object phase. When determining positions of symmetrical structure features, this has no effect on the determined position. When measuring for example linewidths or the position of isolated edges of structure features, in these cases, the intensity distribution of the phase image cannot be directly compared with the intensity distribution of an aerial image of the mask or the mask design.

The phase image is simulated from the predefined structure of the mask, the so-called mask design. From the latter, a phase image is simulated by known computer programs. The optical properties of the microscope used can be taken into account in the simulation of the phase image. In this case, known imaging aberrations of the system can also be taken into account. Moreover, further properties of the method used for phase reconstruction can also be taken into account.

In a further configuration of the invention, the method comprises the following steps:
    determining a first position of a first structure element within the phase image,
    determining a second position of the first structure element within an intensity image,
    determining the deviation of the first position from the second position,
    correcting a third phase image of a second structure element by the determined deviation.

The position of the first structure element within the region is in each case determined from the phase image and from the aerial image of the first structure element. The deviation of the positions is then determined. These measurements and evaluations can be carried out on structure elements of different structure types and on structure elements having different dimensions. In other words, a calibration is carried out. If, subsequently, phase images of structure elements are determined and the position of the structure element is determined from the phase image, it is possible to determine the position of the structure element in an amplitude image.

This measure has the advantage that, as a result of the calibration performed, positions of structure elements such as occur in aerial images can be determined directly from determined phase images.

The invention additionally encompasses a microscope for carrying out the methods mentioned. The microscopes according to the invention comprise an image processing device or a computer which is programmed in such a way that the methods according to the invention are carried out.

It goes without saying that the features of the invention mentioned above and those yet to be explained below can be used not only in the combination described, but also in other combinations or individually, without departing from the scope of the present invention.

BRIEF DESCRIPTION OF DRAWINGS

The invention is described and explained in greater detail below on the basis of some selected exemplary embodiments and with reference to the drawings.

In the figures.

DETAILED DESCRIPTION

Firstly, the construction of a microscope 5 for measurement on substrates is explained below with reference to FIG.

4. The evaluation of the measurement results of this device for determining positions of structure elements on substrates, in particular on masks 2 for lithography, for example transmissive masks or EUV masks, is also explained.

Figure 4:
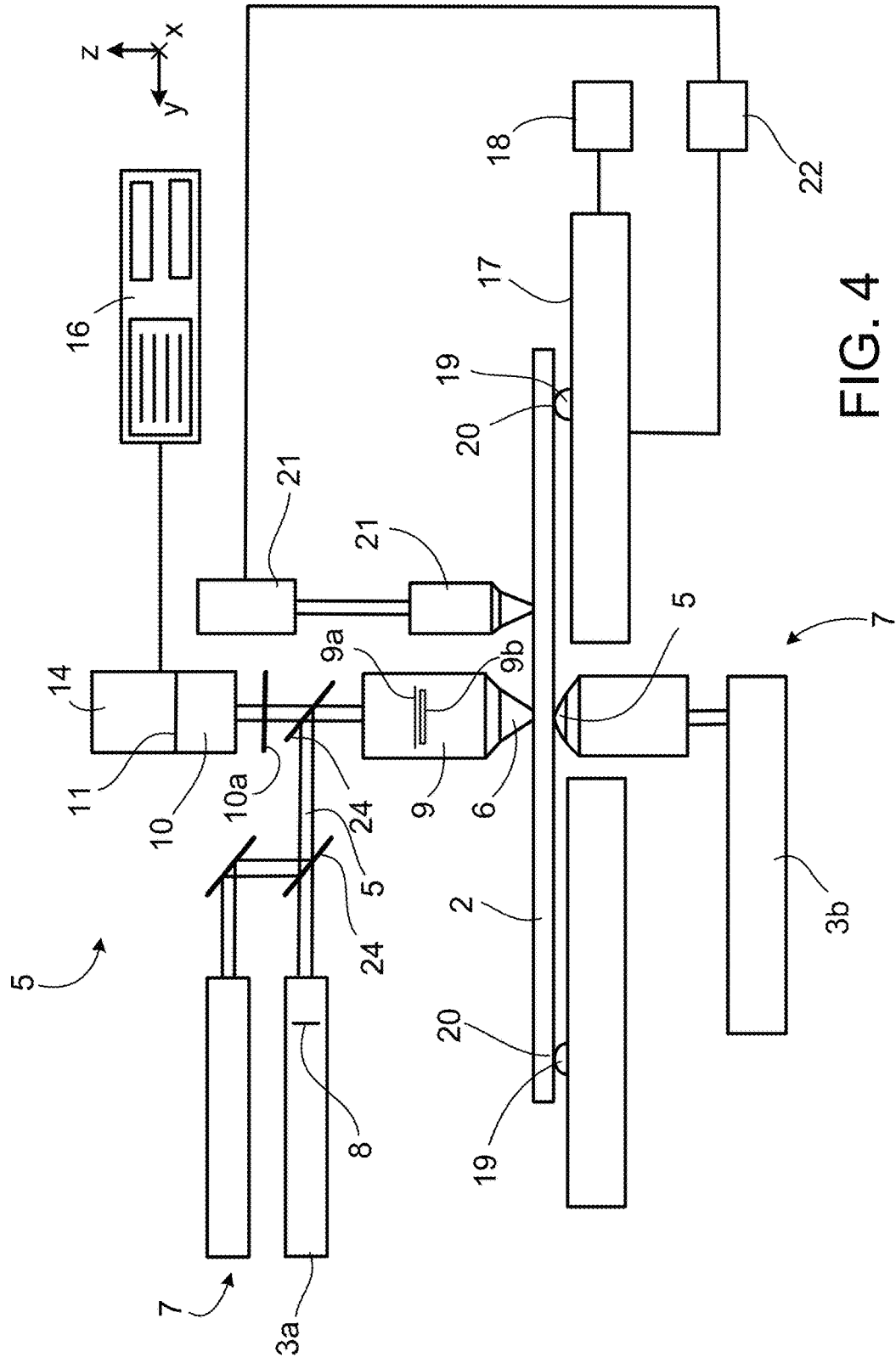
FIG. 4 schematically shows the construction of a microscope for recording images.

In some implementations, the microscope 5 comprises an illumination device 3. Two illumination devices 3a and 3b are illustrated in FIG. 4, wherein the upper illumination device 3a serves for illuminating the substrate 2 for measurements of the reflection. The lower illumination device 3b serves for illuminating the substrate 2 in transmission. The microscope 5 comprises at least one of these two illumination devices 3a, 3b. This can also comprise both illumination devices 3a and 3b. Two different illumination devices 3a, 3b make it possible, in particular, to use the microscope 5 for measurement on different substrates 2.

Figure 5:
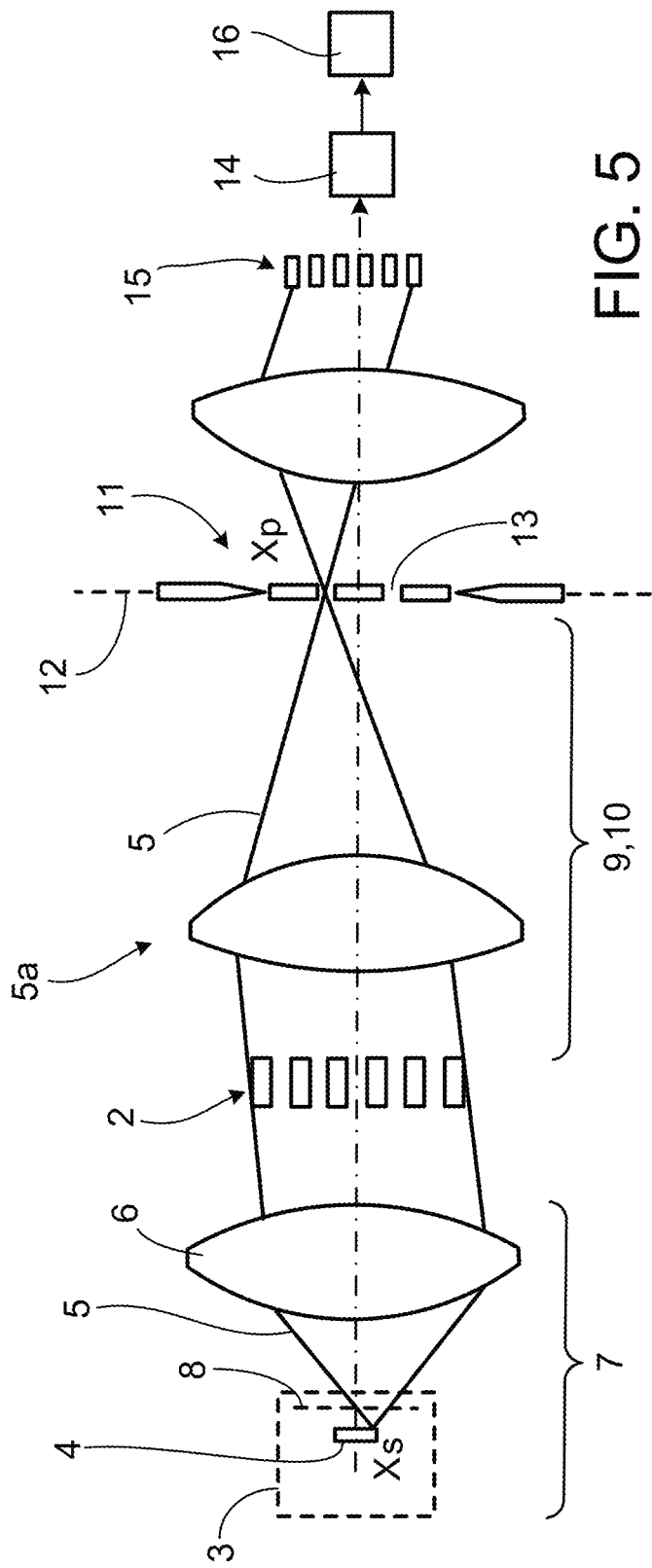
FIG. 5 schematically shows the beam path of a Zernike phase contrast microscope.

The illumination device 3 comprises a radiation source 4 (see FIG. 5). The radiation source 4 can be in particular a laser, in particular an ArF laser. The radiation source 4 serves for generating illumination radiation 6. The illumination radiation 6 has a wavelength of 193 nm. In one variant of the microscope 5, the illumination radiation 6 has a wavelength of 13.5 nm.

Alternative radiation sources 4 which generate illumination radiation 6 having other wavelengths or in a different wavelength range are likewise possible.

The illumination device 3 may be part of an illumination system 7 comprising further optical components.

The illumination system 7 can comprise a stop 8. The stop 8 defines an illumination setting for illuminating the substrate 2. The stop 8 is embodied for example in a ring-shaped fashion, that is to say in an annular fashion. The stop 8 is arranged in the region of the entrance pupil of the illumination system 7. The substrate 2 is then illuminated with a ring-shaped, that is to say annular, illumination setting.

A ring-shaped radiation source can also be used instead of a ring-shaped stop 8. As an alternative thereto, it is possible to arrange a multiplicity of point radiation sources in a ring-shaped region. As an alternative thereto, it is also possible to realize the ring-shaped illumination by use of a correspondingly switched micromirror array.

Besides ring-shaped illumination settings, use is also made of further illumination settings that are customary in lithography, such as e.g. dipolar or quadrupolar illumination settings. Further illumination settings to be predefined as desired can also be used. Monopolar illumination settings which to a good approximation correspond to a coherent radiation of a predefined angle are also used.

The microscope 5 comprises an imaging optical unit 9. The imaging optical unit 9 has an object-side numerical aperture of, e.g., 0.8. The imaging optical unit 9 is also referred to as a projection optical unit.

A magnifying optical unit 10 is arranged downstream of the imaging optical unit 9 in the beam path.

The total magnification of the imaging optical unit 9 and of the magnifying optical unit 10 is, e.g., 265:1.

For some of the measuring methods used, an optical element 9b is used in the pupil plane 9a of the imaging optical unit 9. Said optical element can be embodied as a spatial frequency filter. The spatial frequency filter can be embodied as a pupil stop.

The microscope 5 furthermore comprises a sensor device. The sensor device can be, e.g., a camera, such as a CCD camera 14. An image 15 of the substrate 2 to be examined is recorded by the CCD camera 14.

The CCD camera 14 is connected to an image processing device 16 in a data-transferring manner.

For some of the measuring methods used, a Bertrand lens element is inserted into the optical beam path between the imaging optical unit 9 and the sensor device 14. Said lens element makes it possible to image the pupil plane of the imaging optical unit 9a on the sensor device.

Furthermore, the microscope 5 comprises a holding device 17, also referred to as a stage. The holding device 17 comprises, e.g., three supports 19. The supports 19 form bearing points 20 at which the substrate 2 bears on the holding device 17. The substrate 2 lies on the holding device 17 in particular in such a way that the side to be structured faces upwards. The substrate 2 bears on the supports 19 in particular by the side opposite to the side to be structured.

The holding device 17 serves for positioning the substrate 2 in the beam path of the microscope 1. The holding device 17 is actively controllable. It is controlled by the image processing device 16. It is precisely displaceable, in particular. It has, e.g., six degrees of freedom of displacement. In particular, an interferometer device 18 is provided for determining the position and/or alignment of the holding device 17.

For choosing the region to be measured of the substrate 2, the substrate is moved into a position by the movement of the holding device 17 perpendicular to the optical axis of the imaging optical unit 9 (also referred to as X-Y-plane), such that the region to be measured is situated in the image field of the imaging optical unit 9. For focusing, the holding device is moved in the direction of the optical axis of the imaging optical unit 9 (also referred to as the Z-axis), such that the region to be measured becomes located in the best focal plane. Furthermore, the microscope 5 comprises an autofocus system 23, in which one or a plurality of beam splitters 24 are provided.

Furthermore, the microscope 5 comprises an auxiliary optical unit 21. The auxiliary optical unit 21 is connected, in a data-transferring manner, to a control device 22 for controlling the displacement of the holding device 17. The substrate 2 can be coarsely aligned by use of the auxiliary optical unit 21.

Moreover, the microscope 5 can comprise an interferometer unit (not illustrated in the figures), in particular in the form of an etalon. The etalon serves for monitoring the wavelength of the illumination radiation 6. Variations of the wavelength which can occur on account of pressure, temperature or moisture fluctuations, for example, can be corrected with the aid of the etalon.

The image processing device 16 is embodied, e.g., as a computer that is programmed to control the microscopes mentioned. The image processing device 16 is additionally programmed to carry out the evaluation methods mentioned below.

In one variant of the invention, the microscope 5 is embodied as a Zernike phase contrast microscope 5a. The latter is explained with reference to FIG. 5.

An annular illumination is used which is shaped by a correspondingly shaped stop 8 in the pupil of the illumination device 3. The annular illumination which can be generated with the aid of the radiation source 4 and/or the stop 8 has an inner radius $r_{i0}$. The illumination pupil for illuminating the substrate 2 has an outer radius $R_{ip}$.

The imaging optical unit 9 and the magnifying optical unit 10 are parts of a phase contrast optical unit. The lens element 6 illustrated in FIG. 5 should be understood to be by way of example. This component can also involve a plurality of lens elements and/or one or a plurality of mirrors.

Moreover, the phase contrast optical unit 9, 10, 11 comprises a phase mask 11. The phase mask 11 is arranged in a pupil plane 12 of the beam path of the illumination radiation 5. It is arranged in the beam path downstream of the magnifying optical unit 10.

The phase mask 11 is a $\pi/2$ phase mask. The illumination radiation 5 thus experiences a phase shift by $\pi/2$ upon passing through the phase mask 11.

The phase mask 11 is adapted to the shape of the illumination setting, in particular to the shape of the stop 8. It is embodied in particular in such a way that the stop 8 is imaged precisely onto the phase-shifting region 13 of the phase mask 11. The illumination radiation 5 circulating directly from the radiation source 4 to the phase mask 11, that is to say the illumination radiation 5 which reaches the phase mask 11 in a manner free of diffraction, is thus shifted by $\pi/2$ phases by the phase mask 11. The diffracted illumination radiation 5 does not impinge on the phase-shifting region of the phase mask 11 and remains unchanged. An interference of the diffracted and undiffracted portions of the illumination radiation 5 thus occurs. This in turn makes it possible to determine the phase distribution of the wavefront by use of a detector, e.g., by use of the CCD camera 14.

In some implementations, the phase mask 11 is embodied in particular in a circular fashion or in the shape of a circular ring, in particular in an annular fashion. This is advantageous for a high contrast-to-noise ratio.

For structure features 31 of a mask, a ring-shaped illumination having an inner radius $r_{i,0}$ is provided, whose ratio to the radius $R_{ip}$ of the illumination pupil is in the range of, e.g., 0.4 to 0.5 or in the range of, e.g., 0.5 to 0.6 or in the range of, e.g., 0.6 to 0.7. The outer radius of the illumination is determined by the degree of filling of the illumination pupil. Correspondingly, the phase mask 11 has in the image-side aperture an inner radius $r_{a,0}$ whose ratio to the radius $R_{ap}$ of the image-side aperture is within the ratios mentioned.

If an illumination pupil having a lower degree of filling is used, an illumination of the substrate 2 to be examined with an inner radius $r_{i,0}=0$ is suitable. Here, too, the outer radius is predefined by the degree of filling of the illumination pupil. In this case, the phase mask 11 also has an inner radius $r_{a,0}=0$.

In one variant of the invention, the microscope 5 is embodied as a differential interference contrast microscope. The differential interference contrast method is also referred to as the differential interference contrast or Nomarski contrast method. In this method, as in the case of a Zernike phase contrast microscope 5a, a phase image is generated directly.

The determination of phase images from recordings of a microscope 1 is explained below. Initially only a spatially resolved distribution of the intensity of the illumination radiation is measured by the individual images measured in the image plane of such a microscope 1. Said intensity is the absolute value of the square of the amplitude of the illumination radiation.

The phase image is determined from at least two suitable intensity images of the measured region of the substrate. At least two images are recorded, wherein the recording conditions differ in a defined manner. The changes, which are also referred to as diversifications, are chosen such that they can be described by a mathematical model.

In some implementations, in a method for determining a phase image, for recording the at least two images, the aerial image of the region to be examined is recorded in the best focal plane as first image, and an image of the pupil 9a of the imaging optical unit is recorded as second image. An aerial image of the substrate 2 is recorded by the CCD camera 14. For measuring these images, the substrate is moved into the required position by the holding device 17, such that the region to be measured becomes located in the image field and in the best focal plane of the imaging optical unit 9. For measuring the second image, the Bertrand lens element 10a is introduced into the beam path. A measurement of the pupil plane 9a of the imaging optical unit 9 is then carried out. In this measurement, the region of the substrate within the image field is identical to the measurement of the first image.

In some implementations, in a further method for determining a phase image, the optical element 9a of the imaging optical unit 9 is varied for recording the at least two images. A different spatial frequency filtering is used for each of the images. In a first variant, the first image is recorded without an optical element 9a. An optical element 9a is used for recording the second image. In one variant of the method, the first image is recorded, wherein a first optical element 9a is used, and the second image is recorded, wherein a second optical element 9a is used, which differs from the first optical element 9a. For example, the following are used as optical elements: pupil stops, microlens element arrays or phase filters, as indicated in the published German patent application DE 102007009661, which is incorporated by reference in its entirety in this application. A mathematical model for the performed modification of the pupil of the imaging beam path can be derived by the use of known optical elements. This enables the evaluation—explained further below—of the recordings for determining the phase function.

In one variant of the method, the illumination is diversified for recording the at least two images. This method is also referred to as Fourier ptychography. Different illumination angles are predefined by suitable monopolar stops 8 of the illumination system 3. The aperture angle of the pole is made so small that to a good approximation coherent illumination radiation is provided. This method is described in the publication by G. Zheng et al., in Nature Photonics 7 (2013) 739-745 and also in the published German patent application DE 102014112242. It has been shown that Fourier ptychography is also possible with non- or quasi-coherent illumination. In one variant of the method, the beam shape property of the illumination is diversified. Beam shape property should be understood to mean, for example, the amplitude, the phase of the illumination radiation or the shape of the aperture of the illumination stop 8. These methods are disclosed in the published German patent application DE 102014110302. These methods can be applied according to the invention for determining a phase image. The cited publications are incorporated by reference in their entirety in this patent specification.

In a further method for determining a phase image, the focus or the defocus is diversified for recording the at least two images. By use of the CCD camera 14, an image stack (also referred to as focus stack or Z-stack) of the substrate 2 comprising at least two images having different positions of the focus or defocus is recorded. For measuring these images, the substrate is moved into the required position in the direction of the optical axis of the imaging optical unit 9 by the holding device 17.

The determination of the phase function from the at least two images measured in a diversified manner is effected in an iterative method. This method is referred to as an inverse Fourier-transformation algorithm (abbreviated to IFTA), and also as the Gerchberg-Saxton algorithm, after its creators. In this algorithm, the electric field of the imaged object is propagated back and forth between two or more planes and the boundary conditions in the form of a known intensity are updated in each case. Fourier transformation, Fresnel integral or else vectorial methods can be employed for the propagation. Likewise, the choice of the two reference planes is not limited to pupil and image planes as in the original approach.

The determination of the phase function from the at least two measured images will now be explained on the basis of the already explained measurements of the image in the best focal plane as first image and the pupil of the imaging as second image.

The coordinates x denote functions of the field plane; coordinates u denote functions of the pupil plane. Single letters denote measured values; letters followed by a superscript 'e' denote estimated values.

The measured intensity distribution of an image is given as a function I(x), wherein $x=(x_f, y_f)$ denotes the coordinates within the image plane.

The measured intensity distribution in the pupil plane is given as a function I(u), wherein $u=(x_p, y_p)$ denotes the coordinates within the pupil plane.

The electric field in the image plane is designated by e(x). The electric field in the pupil plane is designated as E(u).

A Fourier relationship is assumed between field plane and pupil plane:

$$E(u) = \hat{F}[|e(x)|]$$

The electric fields can be described as a product of an amplitude term and a phase term:

$$E(u) = |E(u)| \cdot e^{\frac{2\pi \cdot i}{\lambda} \cdot W(u)}$$

$$e(x) = |e(x)| \cdot e^{\frac{2\pi \cdot i}{\lambda} \cdot w(x)}$$

The amplitude function is |E(u)|, and |e(x)|, respectively. For measured aerial images it holds true that: $I(x)=|e(x)|^2$; for measured images of the pupil it holds true that: $I(u)=|E(u)|^2$ The spatially resolved phase in the pupil plane of the imaging is given by the function W(u).

The spatially resolved phase in the field plane of the imaging is given by the function w(x). This function is also referred to as phase function. This function is the sought phase image which is evaluated for position determination according to the invention.

Firstly, arbitrarily uniformly distributed start phases in the pupil are formulated (e.g. statistically).

The Fourier transform of an initially estimated function $E_k^e(u)$ of the pupil plane is calculated:

$$E_k^e(u) = \hat{F}[e_k^e(x)] = |E_k^e(u)| \cdot e^{\frac{2\pi \cdot i}{\lambda} \cdot w_k^e(u)}$$

The estimated function $|E_k^e(u)|$ is replaced by the function $|E(u)|=\sqrt{I(u)}$ known from the measurement:

$$E_k^e(u) = |E(u)| \cdot e^{\frac{2\pi \cdot i}{\lambda} \cdot w_k^e(u)} = \sqrt{I(u)} \cdot e^{\frac{2\pi \cdot i}{\lambda} \cdot w_k^e(u)}$$

By use of the inverse Fourier transformation of this function of the field in the pupil plane, a function of the field in the image plane is obtained:

$$e_k^e(x) = \hat{F}^{-1}[E_k^e(u)] = |e_k^e(x)| \cdot e^{\frac{2\pi \cdot i}{\lambda} \cdot w_k^e(x)}$$

The function $|e_k^e(x)|$ is replaced by the function $|e(x)|=\sqrt{I(x)}$, i.e. by the intensity distribution of the recorded aerial image:

$$e_{k+1}^e(x) = |e(x)| \cdot e^{\frac{2\pi \cdot i}{\lambda} \cdot w_{k+1}^e(x)} = \sqrt{I(x)} \cdot e^{\frac{2\pi \cdot i}{\lambda} \cdot w_{k+1}^e(x)}$$

The index k indicates the number of the iteration of the algorithm.

The termination criterion of the algorithm is given by a minimum of ε by:

$$\varepsilon = \sum_x [|e(x)| - |e_k^e(x)|]^2$$

The phase function w(x) thus obtained is evaluated for the position determination.

The IFTA algorithm described is correspondingly adapted in the evaluation of the at least two measured images which were measured by the further diversification methods mentioned.

In a further configuration of the method, a method referred to as modal phase retrieval is used instead of the IFTA algorithm. A modal decomposition of the unknown phase function is taken as a basis in this method. By applying the extended Nijboer-Zernike theory (ENZ), it is possible to represent the phase function by a small number of complex Zernike polynomials. The unknown phase function is assumed as a combination of known basis functions. The coefficients of the basis functions are optimized until the image stack can be reproduced well. This solution has the advantage that image noise is not amplified by iterative steps and fewer computation steps are required and less computation time is thus required. The method is published in Vol. 32, No. 6, June 2015, Journal of the Optical Society of America A.

If an image stack (Z-stack, focus stack) was recorded, in one variant of the method the evaluation can be effected by evaluating the transport of intensity equation. In the evaluation of an image stack composed of at least two measured images in different focal positions, the mathematical relationship between the derivative of the image intensity I(x) and the focal position z and the gradient of the image phase w(x) is represented as a partial differential equation. This equation is known as the transport of intensity equation, abbreviated to TIE:

$$-k \frac{\partial I(x, y)}{\partial z} - \nabla \cdot [I(x, y) \nabla \varphi(x, y)],$$

where I(x,y) describes the intensity distribution of the phase image and δz describes the change in the focal position.

The differential equation is solved by estimating the intensity gradient on the basis of the intensity change of two or more recorded images of an image stack with further specific conditions being taken into account.

In a further configuration of the method, it is possible to use pixel-based optimizations (e.g. conjugate gradient) or estimation algorithms (e.g. Kalman filtering) for determining the phase. For aerial images having increased noise or in the case of aerial images which were recorded with not fully coherent illumination, these methods allow a more accurate determination of the phase from measurement data, such as, for example, image stacks, than the abovementioned IFTA or TIE methods.

In a further configuration, for determining a phase image, a recording of the region to be examined is created by a Zernike phase contrast microscope or by a differential interference contrast microscope. By use of these microscopes, phase differences of the illumination radiation are represented directly in a spatially resolved manner in an intensity distribution.

Various methods for determining the position of a structure feature 31 in an intensity image are known from the prior art. These methods are applied according to the invention to the determined phase images. Corresponding methods are referred to in the published patent applications US 2010/153059 A, US 2010/254611 A, US 2012/121205 A and US 2012/063666 A, which are hereby fully incorporated in the present application as part thereof. One possible method for the individual image analysis is a so-called symmetry correlation method. This method is suitable for symmetrical structure features 31. For details of this symmetry correlation method, reference should be made to DE 10 2010 047 051 A1, which is hereby fully incorporated in the present application as part thereof.

Figure 6:
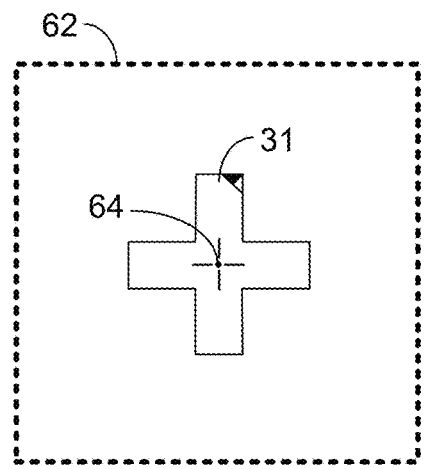
FIGS. 6 to 9 show exemplary illustrations for elucidating the method for determining the accurate position of a structure feature with the aid of a correlation method.

As is illustrated schematically in FIG. 6, the structure feature 31 illustrated in the shape of a cross in FIGS. 6 to 9 is situated exactly in the center of the region to be examined (ROI) 62. In this case, the position of the structure feature 31 corresponds exactly to the center 64 of the region to be examined (ROI) 62. In this case, the position of the structure feature 31 would already be known.

Figure 7:
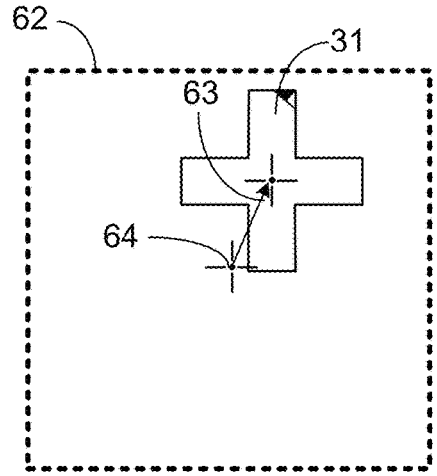
Figure 8:
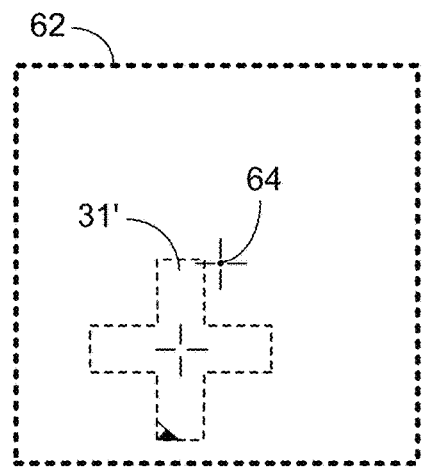
Figure 9:
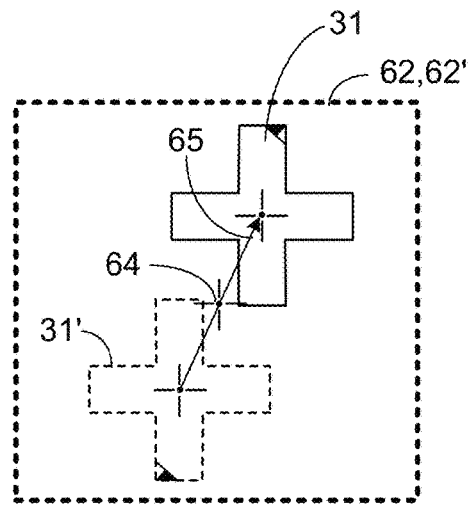

As is illustrated by way of example in FIG. 7, the actual position of the structure feature 31 can deviate from the expected position by an initially unknown absolute value, illustrated as vector 63 in FIG. 7.

From the initially unknown vector 63 it is possible to determine the precise position of the structure feature 31 in the coordinate system of the optical unit and thus including the information about the displacement position of the holding device 17 and/or the flexure of the substrate 2 in the substrate coordinate system.

In the individual image analysis, the region to be examined (ROI) 62 is then point-mirrored at the center 64. In other words, the region to be examined (ROI) 62 is mirrored in the x- and y-directions. This results in the virtual image—illustrated by way of example in FIG. 8—of the region to be examined (ROI) 62', in particular of the structure feature 31'.

The actual image of the structure feature 31 (see FIG. 9) and the virtual image of the structure feature 31' (see FIG. 8) are then correlated in order to determine a displacement vector 65 between the actual position of the structure feature 31 and of the mirrored structure feature 31'. The displacement vector 65 is precisely double the vector 63 that specifies the position of the structure feature 31 relative to the center 64 of the region to be examined (ROI) 62.

During the positioning of the substrate 2 on the supports 19, the substrate 2 can experience flexure on account of gravitation. The absolute value and the exact course of this flexure can be determined from the mechanical properties of the substrate.

Figure 1:
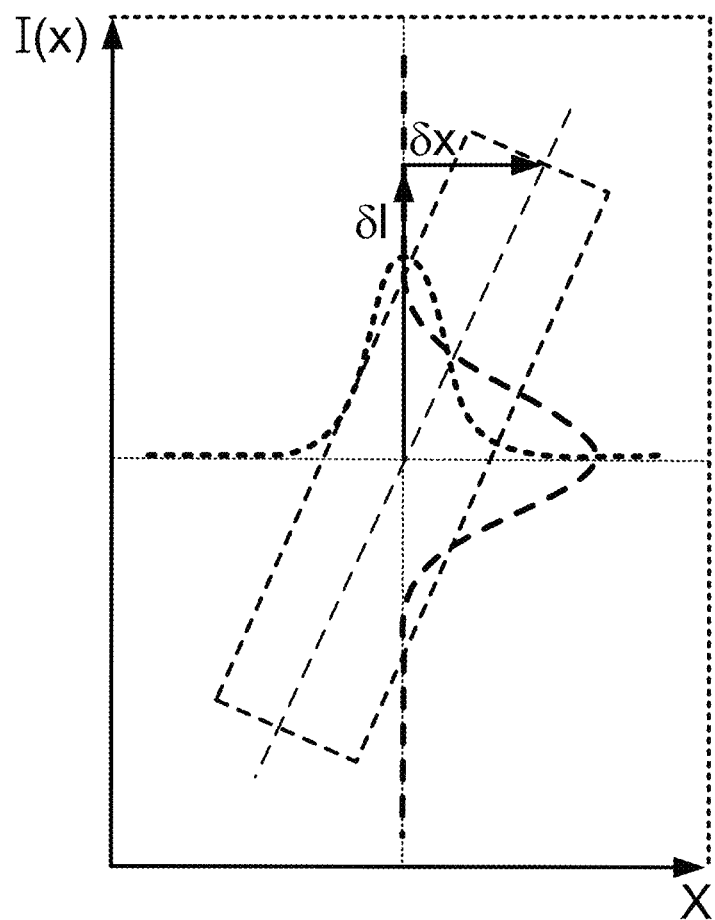
FIG. 1 shows a schematic illustration of the relationship between the image noise $\delta I$ and position noise $\delta x$ of the detection.
Figure 2:
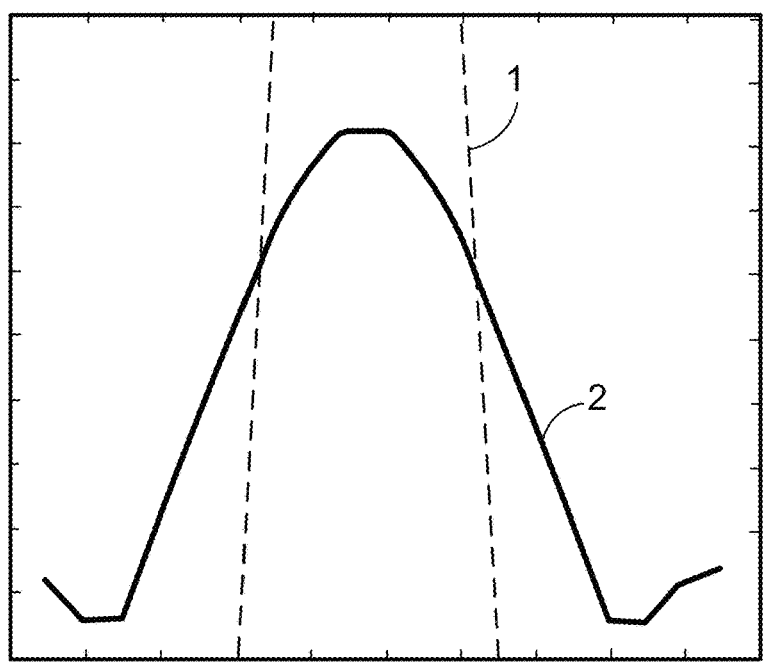
FIG. 2 shows a schematic illustration for comparing the edge steepness of an object amplitude and an image amplitude of the same object.
Figure 3:
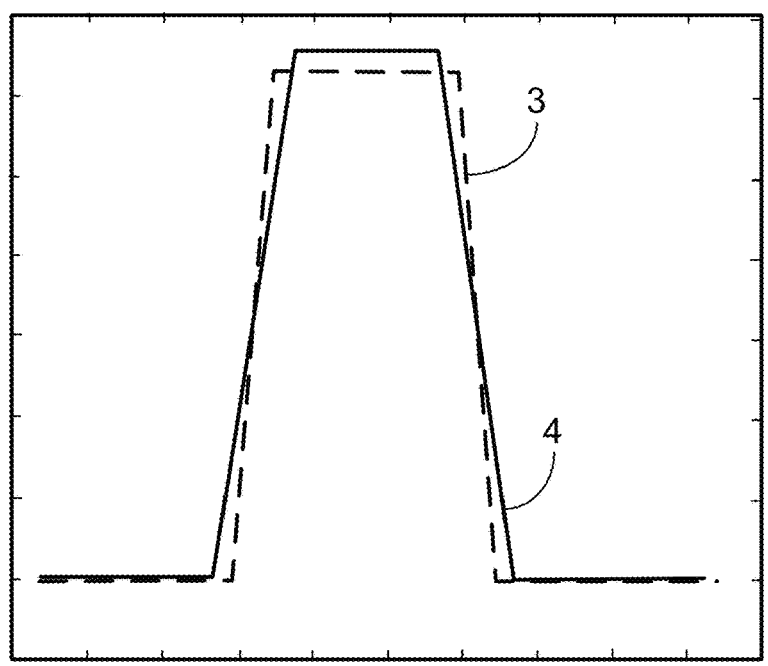
FIG. 3 shows a schematic illustration corresponding to FIG. 2 for comparing the edge steepness of the object phase and the image phase of the same object.

On the basis of the example of the linewidth in FIG. 3 it was explained that in the phase image the linewidth of the image phase 4 can deviate from the object phase. When determining positions of symmetrical structure features, this has no effect on the determined position. When measuring for example linewidths or the position of isolated edges of structure features, this should be taken into account.

For determining the position of a structure feature, in one variant of the method, the measured phase image of a region is compared with a simulated phase image of the region of a mask. The structure of a mask to be examined is predefined in the so-called mask zone. Said mask design is present as a computer-readable file in the examination of a mask. On the basis of these data, a phase image is then simulated by known computer programs. The optical properties of the microscope used are taken into account in the simulation of the phase image. In this case, known imaging aberrations of the system can also be taken into account. Moreover, further properties of the methods used for phase reconstruction can also be taken into account.

In one variant of the method, the positions of structure elements are determined on measured intensity images and also on phase images. From the phase image and from the intensity image of a structure element, the position of the structure element within the region is then determined in each case according to one of the methods described. The deviation of the positions is then determined. These measurements and evaluations are carried out on structure elements of different structure types and on structure elements having different dimensions. If, subsequently, phase images of structure elements are determined and the position of the structure element is determined from the phase image, it is possible to determine the position of the structure element in an amplitude image, without recording this. For determining the position within the amplitude image, the position determined from the phase image is corrected by the corresponding deviation. In this case, for determining the deviation, the deviation of a structure element which is as similar as possible to the measured structure element is selected. In the case of structure elements of different sizes, an interpolation between the deviations is possible. A corresponding function of the deviation depending on the structure size can also be created ("fitted").

Figure 10:
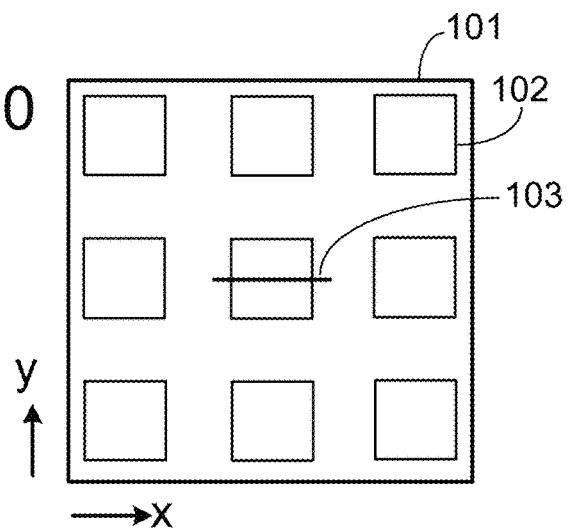
FIG. 10 shows one example of a predefined structure of a mask having a structure feature to be examined.
Figure 11:
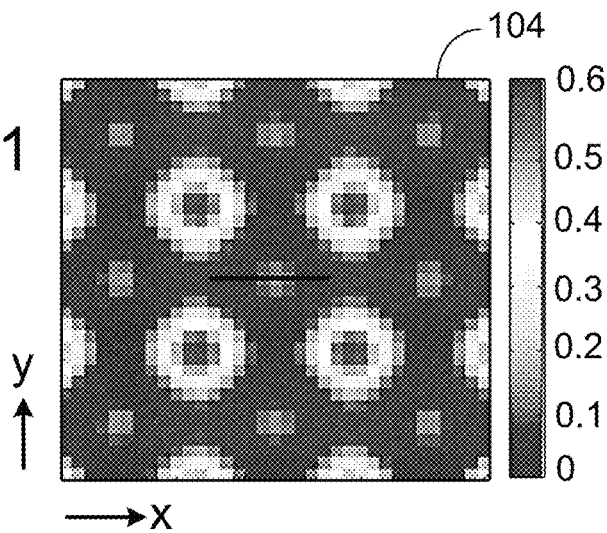
FIG. 11 shows an aerial image of the region from FIG. 10.

The method will be explained on the basis of an example. A region 101 of a mask comprising a 3×3 matrix of square contact holes 102 is provided. This is depicted schematically in FIG. 10. The width of a contact hole 102 and the position of an edge of the contact hole 102 are intended to be measured. An aerial image 104 of the region 101 which was recorded by a microscope 5 is shown in FIG. 11. An image stack of five equidistant images was recorded with respect to the region 101 of the mask. FIG. 11 shows the image of the best focal plane. Two images respectively above and below the best focal plane are not illustrated.

Figure 12:
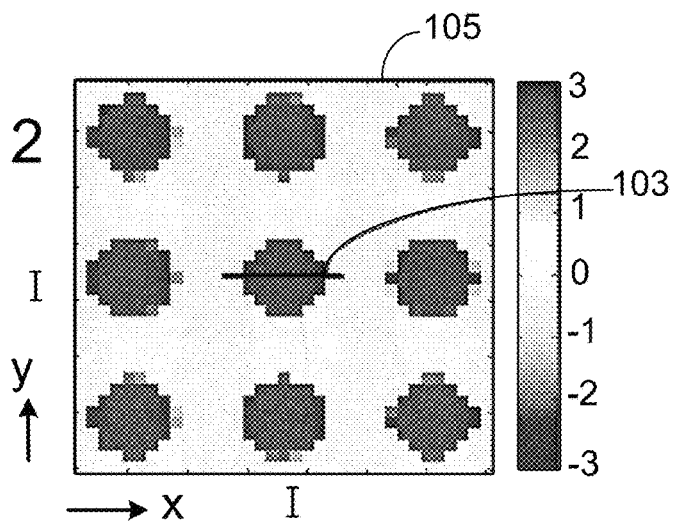
FIG. 12 shows a phase image of the region from FIG. 10.

A phase image which was determined from an image stack is illustrated in FIG. 12. For evaluation purposes, the intensity profile of the phase image in the cross section 103 through a contact hole 102 is evaluated. The cross section is indicated by a straight line in FIGS. 10 to 12.

Figure 13:
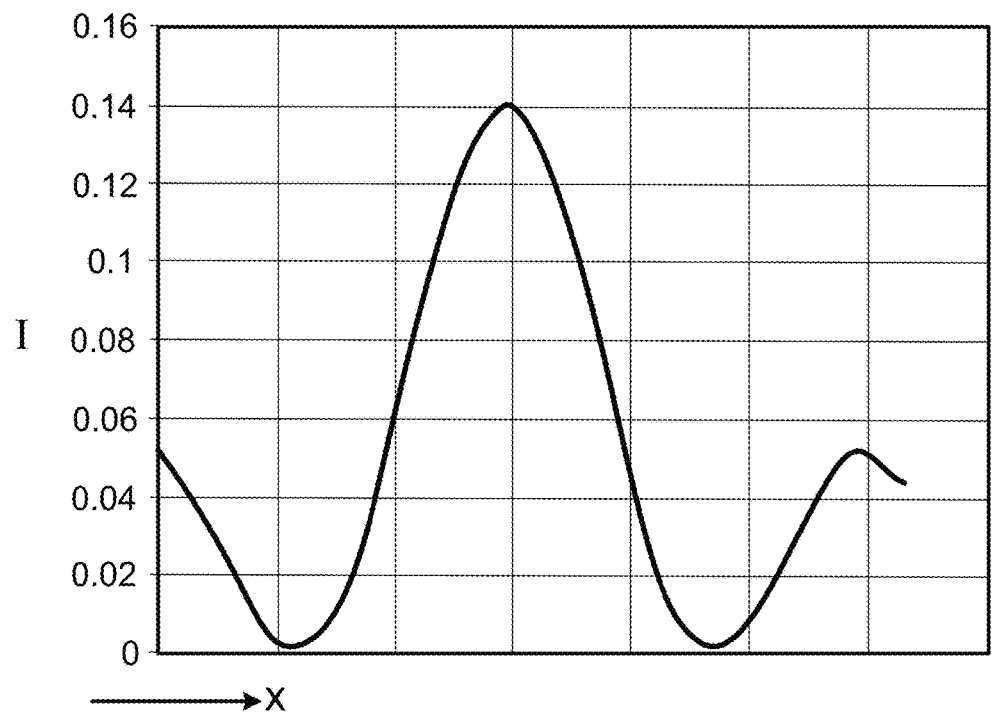
FIG. 13 shows a longitudinal section through a structure element of the aerial image of the region from FIG. 10.
Figure 14:
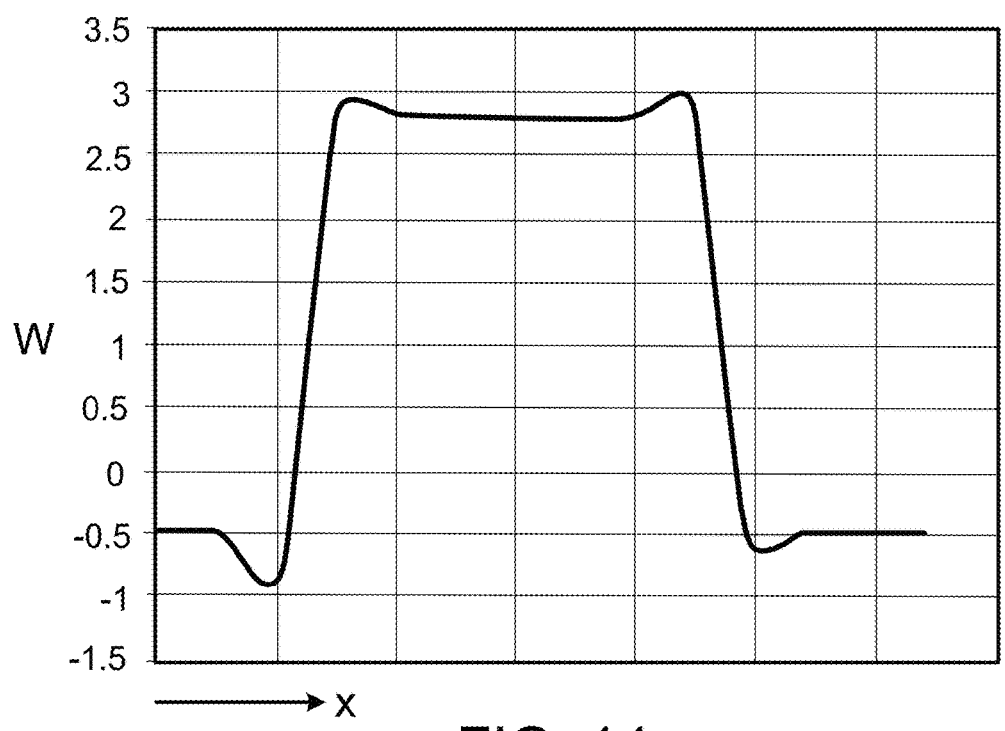
FIG. 14 shows a longitudinal section through a structure element of the phase image of the region from FIG. 10.

The intensity profile in the cross section of the amplitude image 104 of a contact hole 102 is illustrated in FIG. 13. The intensity profile in the cross section of the phase image 105 of a contact hole is illustrated in FIG. 13. According to the invention, the edges of the phase image are steeper than those of the amplitude image.

The evaluation of the position of the edge and width of the contact hole is then effected by one of the methods mentioned above.

Figure 15:
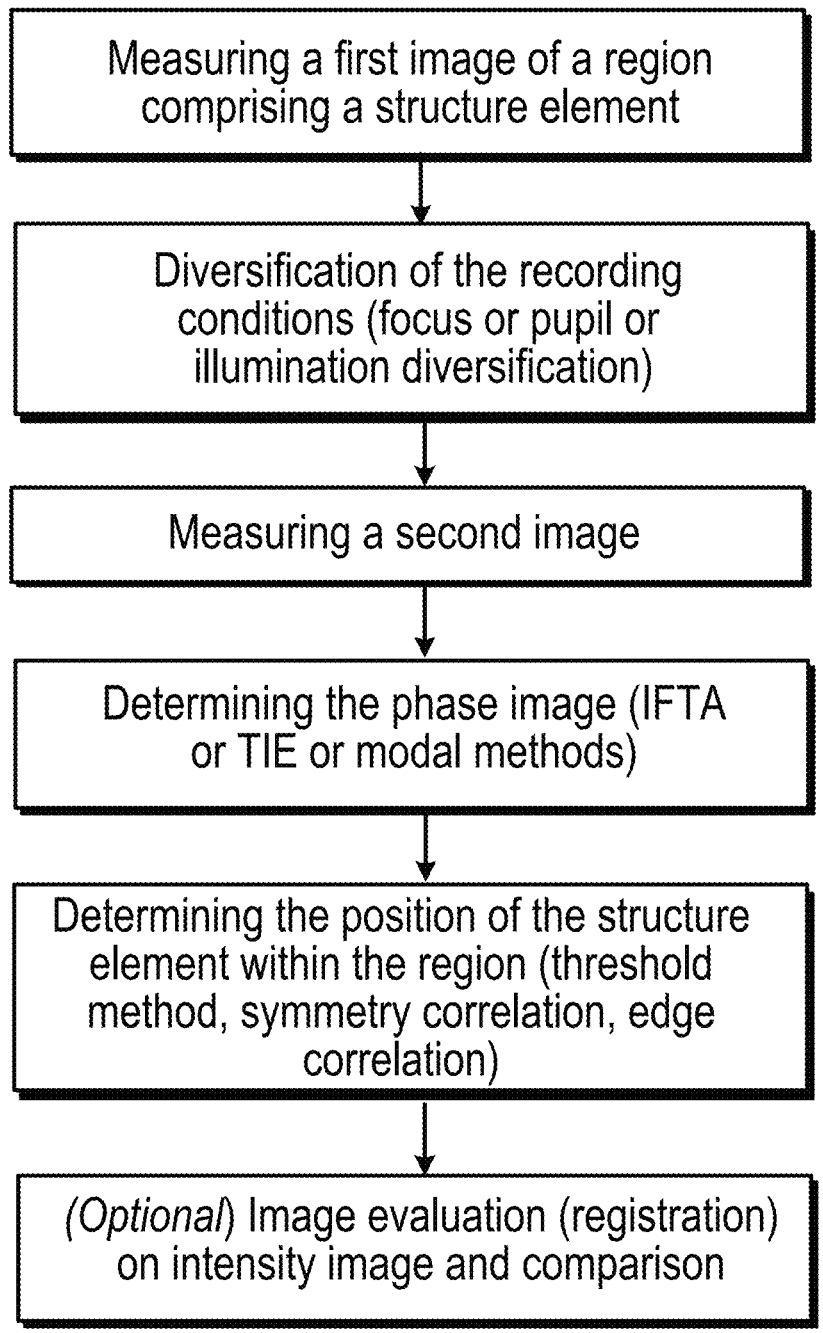
FIG. 15 shows a schematic illustration of the method sequence of a method for recording and evaluating phase images.

The sequence of the method according to the invention is illustrated in FIG. 15. Referring to FIG. 15, a first image of a region comprising a structure element is measured. Diversification of the recording conditions is performed (e.g., focus or pupil or illumination diversification). A second image is measured. The phase image is determined (e.g., IFTA or TIE or modal methods). The position of the structure element within the region is determined (e.g., threshold method, symmetry correlation, edge correlation). Optionally, image evaluation (registration) on intensity image and comparison are performed.

The features described above related to processing of data (for example, processing images, determining phase functions, performing Fourier transforms or inverse Fourier transforms) can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

The image processing device 16 may include suitable processors for the execution of a program of instructions, including, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a liquid crystal display (LCD) or organic light emitting diode (OLED) monitor for displaying information to the user and a keyboard and a pointing device such as a mouse or a trackball by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for determining a position of a structure element on a mask, comprising the following steps:
   predefining a region on the mask which comprises at least the structure element,
   determining a phase image of the region, wherein the phase image comprises in a spatially resolved manner the phase of the imaging of the mask by the illumination radiation, and
   determining the position of the structure element within the phase image;
   wherein, for determining the phase image, at least two aerial images of the region of the mask are recorded, wherein the at least two aerial images are recorded under diversified conditions determining the positioning error of the structure element as distance of the position of the structure element from a set point position of the structure element in the phase image.

2. The method according to claim 1, comprising the following step:
   determining the setpoint position of a structure element from the position of the structure element within a simulated phase image of the region of the mask.

3. The method according to claim 1, comprising the following steps:
   determining a first position of a first structure element within the phase image,
   determining a second position of the first structure element within an intensity image,
   determining the deviation of the first position from the second position, and
   correcting a third phase image of a second structure element by the determined deviation.

4. The method according to claim 1, wherein the diversifications can be described by mathematical models.

5. The method according to claim 1, wherein the diversification is effected by the recording of the at least two aerial images in parallel planes spaced apart from one another.

6. The method according to claim 1, wherein the recording of one of the aerial images is effected in the best focal plane.

7. The method according to claim 1, wherein the diversification is effected by a spatial frequency filtering in the pupil plane of the imaging beam path of the imaging.

8. The method according to claim 1, wherein the diversification is effected by the recording of the at least two aerial images with different illumination directions.

9. The method according to claim 1, wherein determining the phase image is effected by recording an image of the region by use of a phase contrast microscopy.

10. A microscope comprising:
an imaging optical unit for recording an aerial image of a predefined region on a mask which comprises at least a structure element,
a detector for recording the aerial image, and
an image processing device configured to carry out the following steps:
predefining a region on the mask which comprises at least the structure element,
determining a phase image of the region, wherein the phase image comprises in a spatially resolved manner the phase of the imaging of the mask by the illumination radiation, and
determining the position of the structure element within the phase image,
wherein, for determining the phase image, at least two aerial images of the region of the mask are recorded, wherein the at least two aerial images are recorded under diversified conditions determining the positioning error of the structure element as distance of the position of the structure element from a set point position of the structure element in the phase image,
wherein aerial images recorded by the microscope are used.

11. The microscope of claim 10 in which the diversifications can be described by mathematical models.

12. The microscope of claim 10 in which the diversification is effected by the recording of the at least two aerial images in parallel planes spaced apart from one another.

13. The microscope of claim 10 in which the recording of one of the aerial images is effected in the best focal plane.

14. The microscope of claim 10 in which the diversification is effected by a spatial frequency filtering in the pupil plane of the imaging beam path of the imaging.

15. The microscope of claim 10 in which the diversification is effected by the recording of the at least two aerial images with different illumination directions.

16. The microscope of claim 10 in which determining the first phase image is effected by recording an image of the region by use of a phase contrast microscopy.

17. The microscope of claim 10 in which the image processing device is configured to carry out the following step: determining the setpoint position of a structure element from the position of the structure element within a simulated phase image of the region of the mask.

18. The microscope of claim 10 in which the image processing device is configured to carry out the following steps:
determining a first position of a first structure element within the phase image,
determining a second position of the first structure element within an intensity image,
determining the deviation of the first position from the second position, and
correcting a third phase image of a second structure element by the determined deviation.

19. A microscope comprising:
an imaging optical unit for recording a phase image of a predefined region on a mask which comprises at least a structure element,
a detector for recording the phase image,
an image processing device configured to carry out the following steps:
predefining a region on the mask which comprises at least the structure element,
determining a phase image of the region, wherein the phase image comprises in a spatially resolved manner the phase of the imaging of the mask by the illumination radiation, and
determining the position of the structure element within the phase image,
wherein, for determining the phase image, at least two aerial images of the region of the mask are recorded, wherein the at least two aerial images are recorded under diversified conditions determining the positioning error of the structure element as distance of the position of the structure element from a set point position of the structure element in the phase image,
wherein phase images recorded by the microscope are used.

20. The microscope of claim 19 in which the diversifications can be described by mathematical models.

21. The microscope of claim 19 in which the diversification is effected by the recording of the at least two aerial images in parallel planes spaced apart from one another.

22. The microscope of claim 19 in which the recording of one of the aerial images is effected in the best focal plane.

23. The microscope of claim 19 in which the diversification is effected by a spatial frequency filtering in the pupil plane of the imaging beam path of the imaging.

24. The microscope of claim 19 in which the diversification is effected by the recording of the at least two aerial images with different illumination directions.

25. The microscope of claim 19 in which determining the first phase image is effected by recording an image of the region by use of a phase contrast microscopy.

26. The microscope of claim 19 in which the image processing device is configured to carry out the following step: determining the setpoint position of a structure element from the position of the structure element within a simulated phase image of the region of the mask.

27. The microscope of claim 19 in which the image processing device is configured to carry out the following steps:
determining a first position of a first structure element within the phase image,
determining a second position of the first structure element within an intensity image,
determining the deviation of the first position from the second position, and
correcting a third phase image of a second structure element by the determined deviation.

* * * * *

UNITED STATES PATENT AND TRADEMARK OFFICE
CERTIFICATE OF CORRECTION

PATENT NO.        : 10,089,733 B2
APPLICATION NO.   : 15/281760
DATED             : October 2, 2018
INVENTOR(S)       : Dirk Seidel Page 1 of 1

It is certified that error appears in the above-identified patent and that said Letters Patent is hereby corrected as shown below:

On the Title Page

Column 2 Item (57) (Abstract), Line 2, delete "provide." and insert -- provided. --

Signed and Sealed this
Eleventh Day of December, 2018

Andrei Iancu
*Director of the United States Patent and Trademark Office*